United States Patent
Yamazaki

(10) Patent No.: US 7,397,881 B2
(45) Date of Patent: Jul. 8, 2008

(54) ERRONEOUS PHASE LOCK DETECTION CIRCUIT

(75) Inventor: Daisuke Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 438 days.

(21) Appl. No.: 11/038,084

(22) Filed: Jan. 21, 2005

(65) Prior Publication Data
US 2005/0123087 A1 Jun. 9, 2005

Related U.S. Application Data

(63) Continuation of application No. PCT/JP02/12977, filed on Dec. 11, 2002.

(51) Int. Cl.
*H03D 3/24* (2006.01)
(52) U.S. Cl. ............... 375/373; 375/376; 327/156
(58) Field of Classification Search ............ 375/376, 375/373; 327/156
See application file for complete search history.

(56) References Cited

U.S. PATENT DOCUMENTS

| | | | |
|---|---|---|---|
| 4,262,264 A | * | 4/1981 | Vandegraaf .................. 331/4 |
| 4,371,974 A | * | 2/1983 | Dugan ...................... 375/328 |
| 5,530,383 A | * | 6/1996 | May ......................... 327/39 |
| 6,064,236 A | * | 5/2000 | Kuwata et al. ............... 327/12 |
| 7,068,747 B2 | * | 6/2006 | Rokugawa et al. ........... 375/360 |

FOREIGN PATENT DOCUMENTS

| | | |
|---|---|---|
| JP | 11-112335 | 4/1999 |
| JP | 2000-183731 | 6/2000 |
| JP | 2002-111458 | 4/2002 |
| JP | 2002-314518 | 10/2002 |

* cited by examiner

*Primary Examiner*—Temesghen Ghebretinsae
(74) *Attorney, Agent, or Firm*—Staas & Halsey LLP

(57) ABSTRACT

The present invention is concerned with a phase comparator circuit and provides an erroneous phase lock detection circuit that detects erroneous phase lock occurring when the duty cycle of data deviates from 100% in a comparison of a phase difference between the data and a clock. The erroneous phase lock detection circuit incorporated in a phase comparator that detects a phase difference between data and a clock comprises: a first phase detection unit that detects a phase difference by measuring a difference between the leading edge of the data and the phase of the clock and transmits an average of phase differences; a second phase detection unit that detects a phase difference by measuring a difference between the trailing edge of the data and the phase of the clock and transmits an average of phase differences; and an erroneous phase lock verification unit that, when the difference between the average phase difference sent from the first phase detection unit and the average phase difference sent from the second phase detection unit exceeds a predetermined range, verifies erroneous phase lock.

5 Claims, 13 Drawing Sheets

Fig. 3
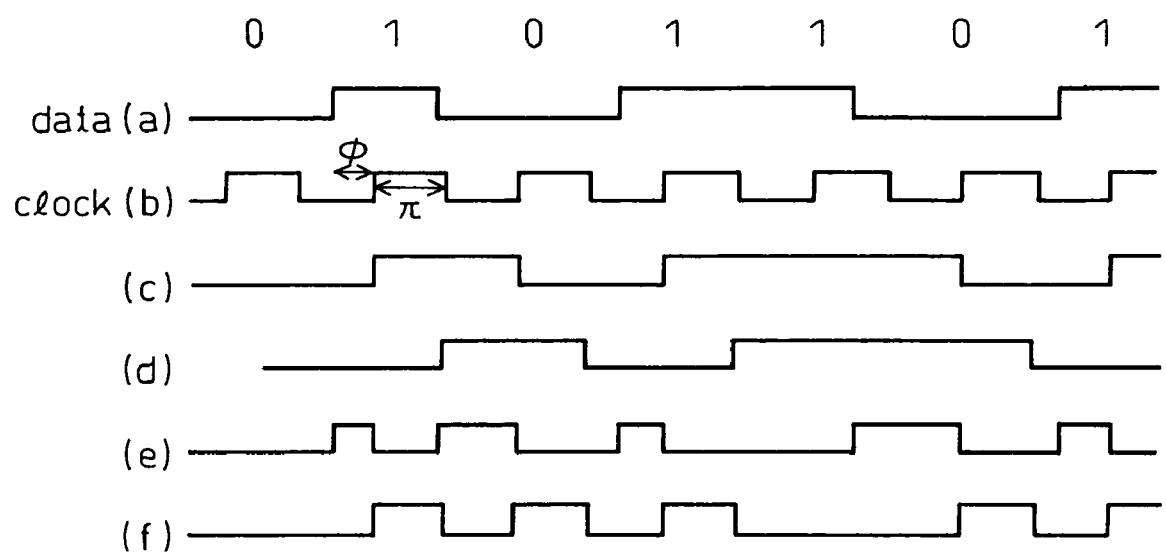
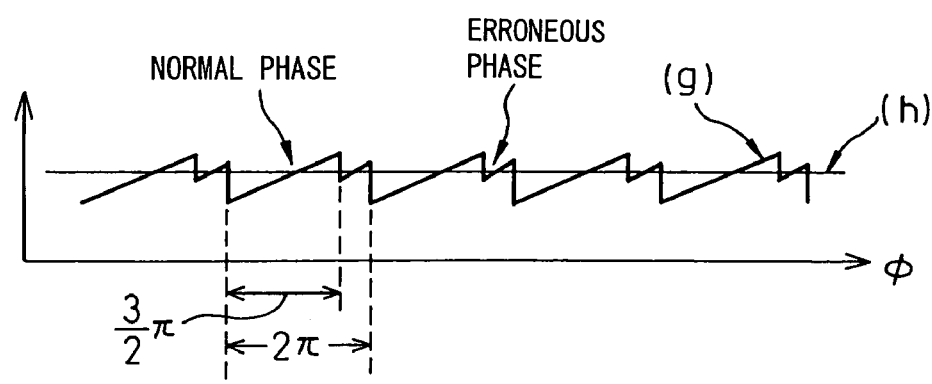

Fig.11
(a)
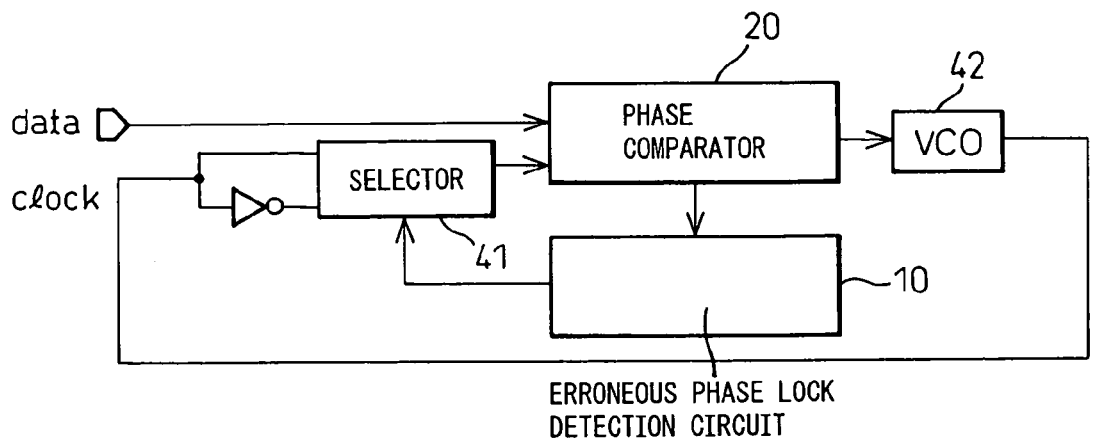
(b)
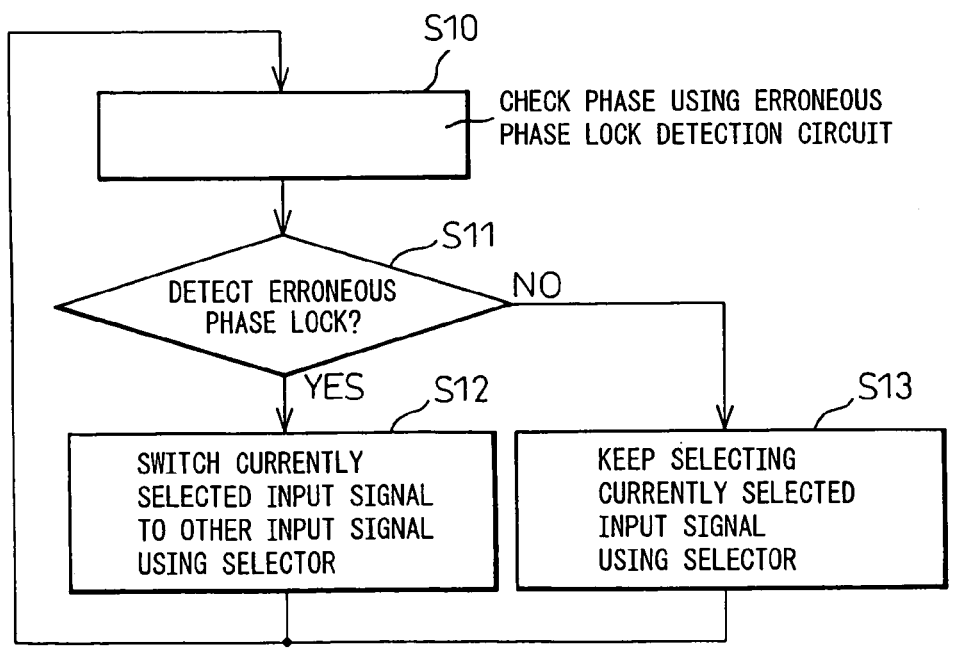

Fig.12
(a)
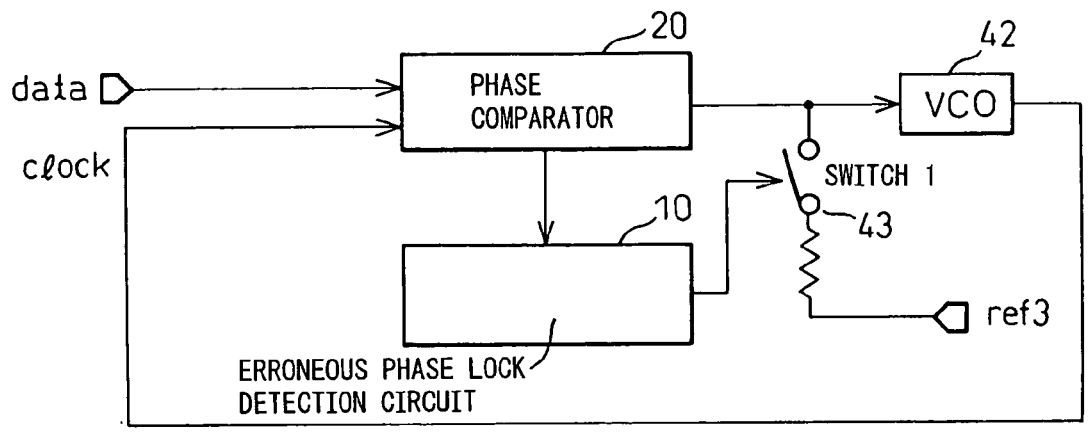
(b)
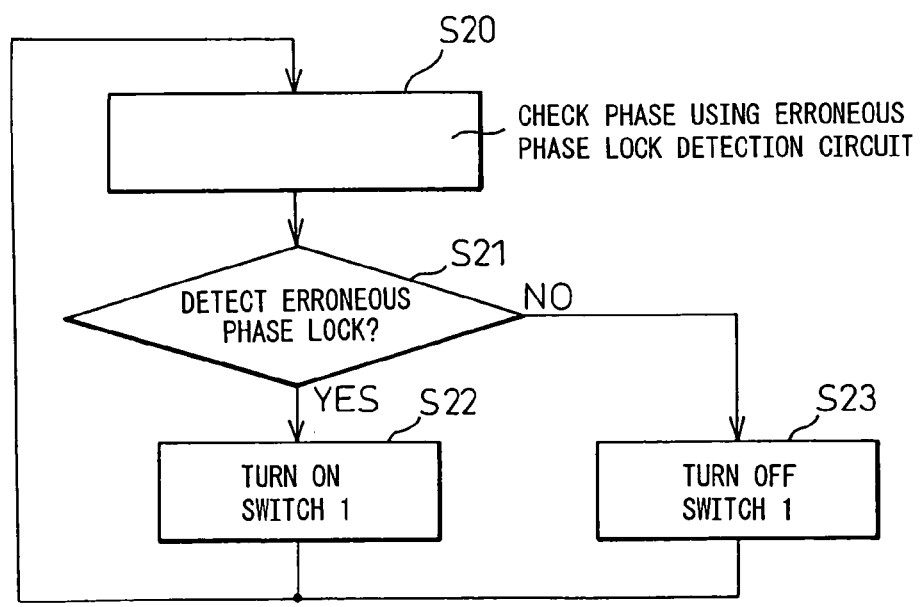

Fig.13
(a)
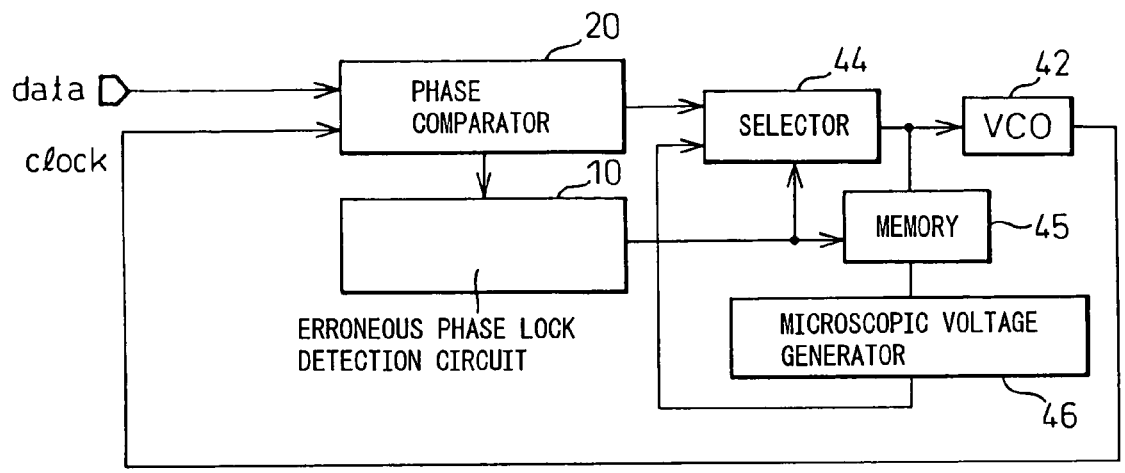
(b)
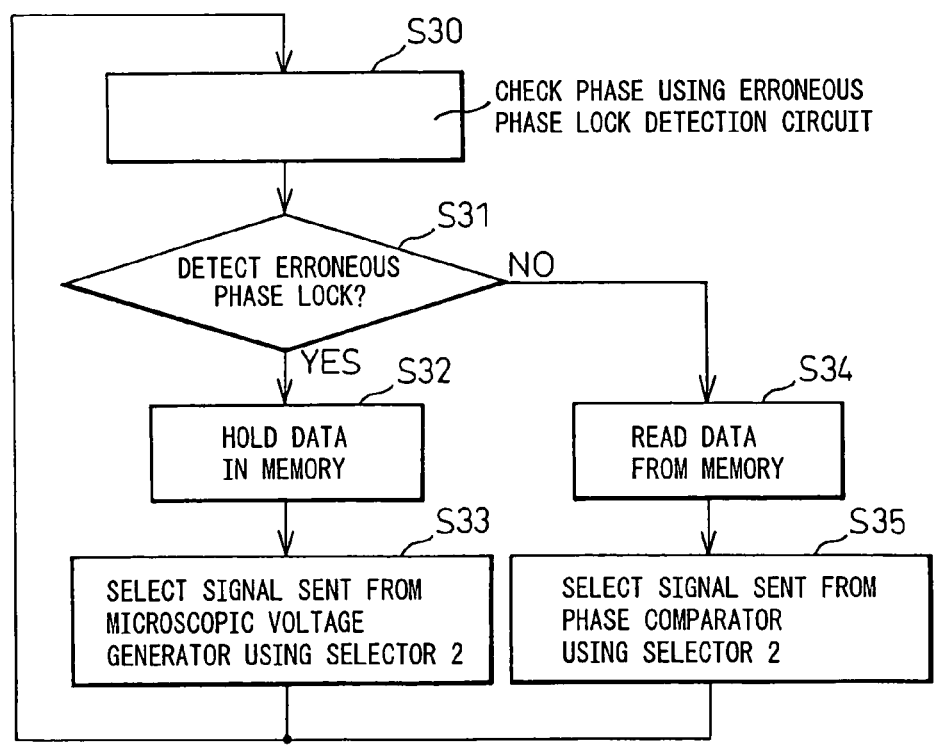

Fig.16
(a)
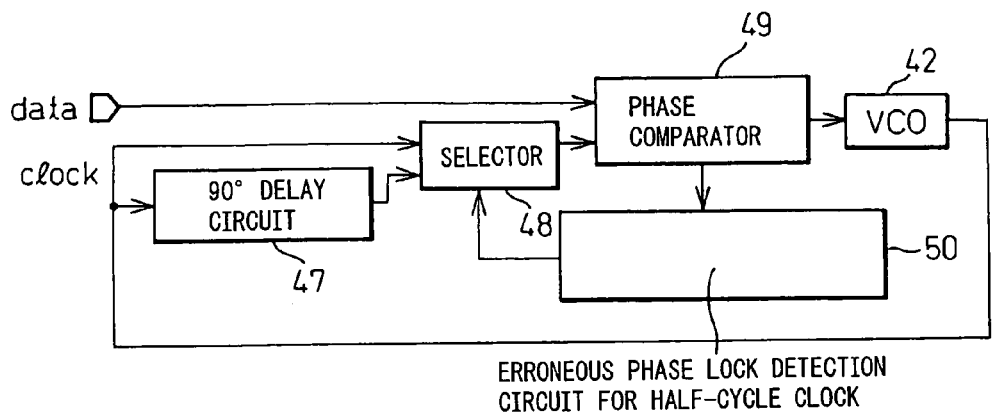
(b)
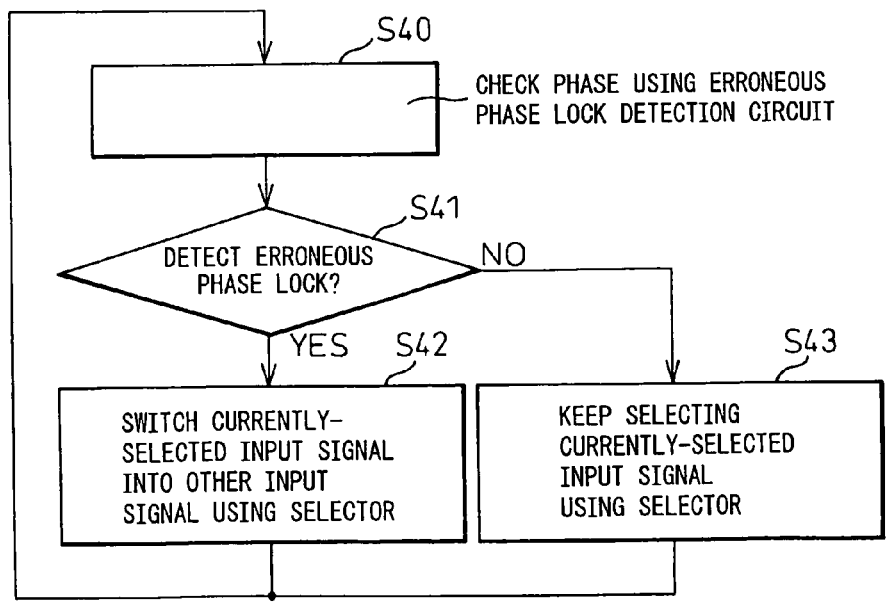

ERRONEOUS PHASE LOCK DETECTION CIRCUIT

CROSS-REFERENCE TO RELATED APPLICATION

This application is a continuation application and is based upon PCT/JP02/12977, filed on Dec. 11, 2002.

BACKGROUND OF THE INVENTION

1. Field of the Invention

The present invention relates to a phase comparison circuit or, more particularly, to a circuit for detecting erroneous phase lock occurring when the duty cycle of data deviates from 100% during comparison of the data with a clock during which a phase difference between the data and clock is detected.

2. Description of the Related Art

At a receiving terminal station of an optical transmission system, synchronous reproduction is performed in order to convert a data wave, which is distorted due to the characteristic of an optical transmission line or convolution of noise, into an original fine digital signal. In general, a phase-locked loop (PLL) is used to generate a clock whose frequency is synchronous with the repetition frequency of received data. The clock is used to identify received data and the data is reproduced.

For example, when a non-return-to-zero (NRZ) signal to be transmitted at a bit rate of several tens of gigabits per second is adopted as a signal carrying data, the bit time is as short as several tens of picoseconds. If the signal is affected with the foregoing distortion or noise, the time during which data can be identified is very short. The phase of a clock produced by the PLL must lock onto the phase of received data with an optimal relationship maintained between the phases.

FIG. 1 shows a Hogge-type phase comparator generally employed in a PLL. FIG. 2 is a timing chart showing the waveforms of signals observed when an NRZ signal having a duty cycle of 100% is adopted as a data-carrying signal. In FIG. 2, signals (a) to (h) are signals developed at nodes (a) to (h) in FIG. 1. The duty cycle is the ratio (t/T) 100 (%) of a pulse duration t during which data or a bit "1" persists to an interval T between pulses or bits, wherein a bit rate is expressed as f=1/T.

The Hogge-type phase comparator comprises two D flip-flops 1 and 2, two exclusive OR circuits 3 and 4, and two analog rectification circuits (filters) 5 and 6. The D flip-flop 1 and exclusive OR circuit 3 detect (produce a signal e) a period φ from the change in input data (the leading or trailing edge of input data) to the leading edge of a clock. On the other hand, the D flip-flop 2 and exclusive OR circuit 4 detect (produce a signal f) a period π from the change in the output of the D flip-flop 1 (the leading or trailing edge) to the trailing edge of the clock.

The period φ provided by the exclusive OR circuit 3 varies depending on the temporal relationship between the change in the input data and the leading edge of the clock. The period π provided by the exclusive OR circuit 4 is always half the cycle of the clock. Moreover, the number of outputs φ of the exclusive OR circuit 3 is always equal to the number of outputs π of the exclusive OR circuit 4. Consequently, when the leading edge of the clock is in the center of input data, the period φ provided by the exclusive OR circuit 3 and the period π provided by the exclusive OR circuit 4 are equal to each other and are half the cycle of the clock.

Assume that the output φ of the exclusive OR circuit 3 and the output π of the exclusive OR circuit 4 are rectified by the respective filters 5 and 6 in order to produce rectified signals g and h respectively. When the rectified signal h of the output π of the exclusive OR circuit 4 is used as a reference, the rectified signal g of the output φ of the exclusive OR circuit 3 is regarded as a sawtooth wave whose level varies by the half cycle of the clock in both directions with the reference level as a center (see FIG. 2).

A time point at which the rectified outputs cross, that is, a time point at which the leading edge of the clock comes in the center of input data is regarded as an optimal time point of identification. The output frequency of a voltage-controlled oscillator (VCO) included in the PLL is controlled so that the rectified outputs will be equal to each other (g=h), whereby the leading edge of the clock stably coincides with at the optimal time point of identification within the cycle of input data.

FIG. 3 is a timing chart showing the waveforms of signals observed when an NRZ signal having a duty cycle of 75% is adopted as a data-carrying signal. In FIG. 3, signals (a) to (h) are signals developed at the nodes (a) to (h) in FIG. 1.

When the duty cycle of data deviates from 100%, the output of the PLL may lock onto a phase different from the phase onto which the output should lock. As mentioned previously, when the duty cycle of data is 100%, the data wave has only one slope in one direction within one cycle (0 to 2π) and an average signal level attained during the time equivalent to one slope is detected at the same phase over all the cycles. However, when the duty cycle deviates from 100%, the wave has two slopes in the same direction within one cycle and the average signal levels attained during the times equivalent to the two slopes are the same as each other and detected in two phases of a normal phase and an erroneous phase.

When the duty cycle of data is 75%, as long as a phase difference of the data from a clock is limited, the average signal level varies in the same manner as it does when the duty cycle if 100%. However, if the phase difference of the data from the clock exceeds 1.5π (75%), the edge of the clock comes after the trailing edge of the data. Therefore, a clock pulse produced when the phase difference is equal to or smaller than 1.5π may not be produced.

In this case, a sawtooth wave exhibits two phases within one cycle (2π) (g and h), that is, exhibits a normal phase and an erroneous phase in which the wave assumes the same average signal level as it does in the normal phase. Consequently, conventionally, if the erroneous phase locks onto the phase of a clock, the time during which data is identified becomes very short or it becomes impossible to reproduce data.

Referring to FIG. 3, a description has been made of a case where the duty cycle of data decreases from 100%. Even when the duty cycle becomes equal to or larger than 100% or, for example, 125%, a sawtooth wave exhibits two phases within one cycle thereof (2π) and has two slopes in the same direction.

Patent Documents relevant to the foregoing related art include Japanese Unexamined Patent Application Publication No. 2000-183731 (see FIG. 35 to FIG. 38) and Japanese Patent No. 3094971 (see FIG. 1 to FIG. 3).

SUMMARY OF THE INVENTION

Accordingly, an object of the present invention is to provide an erroneous phase lock detection circuit that is incorporated in a phase comparator circuit included in a PLL and that detects erroneous phase lock occurring when the duty cycle of data deviates from 100%.

Another object of the present invention is to provide an erroneous phase lock detection circuit including a facility that, when erroneous phase lock is detected, extends control so as to detect a normal phase.

According to the present invention, an erroneous phase lock detection circuit incorporated in a phase comparator that detects a phase difference between data and a clock comprises: a first phase detection unit that detects a phase difference by measuring a difference between the leading edge of the data and the phase of the clock and transmits an average of phase differences; a second phase detection unit that detects a phase difference by measuring a difference between the trailing edge of the data and the phase of the clock and transmits an average of phase differences; and an erroneous phase lock verification unit that, when the difference between the average phase difference sent from the first phase detection unit and the average phase difference sent from the second phase detection unit exceeds a predetermined range, verifies an erroneous phase lock.

According to the present invention, a phase comparator that detects a phase difference between data and a clock comprises: a first frequency divider that provides an output, of which frequency is a half of the frequency of data, at the leading edge of the data; a second frequency divider that provides an output, of which frequency is a half of the frequency of the data, at the trailing edge of the data; and a clock generator that generates a half-cycle clock by halving the frequency of the clock. An erroneous phase lock detection circuit incorporated in the phase comparator comprises: a first phase detection unit that detects a phase difference between the data sent from the first frequency divider and the half-cycle clock and transmits an average of phase differences; a second phase detection unit that detects a phase difference between the data sent from the second frequency divider and the half-cycle clock and transmits an average of phase differences; and an erroneous phase lock verification unit that, when the difference between the average phase difference sent from the first phase detection unit and the average phase difference sent from the second phase detection unit exceeds a predetermined range, verifies an erroneous phase lock.

BRIEF DESCRIPTION OF THE DRAWINGS

FIG. 3 is a timing chart showing the waveforms of signals observed when an NRZ signal having a duty cycle of 75% is adopted as a signal carrying data transferred to the comparator shown in FIG. 1;

FIG. 11 shows the first example of a phase control circuit;

FIG. 12 shows the second example of a phase control circuit;

FIG. 13 shows the third example of a phase control circuit;

FIG. 16 shows an example of a phase control circuit included in the embodiment shown in FIG. 14.

DESCRIPTION OF THE PREFERRED EMBODIMENTS

Figure 4:
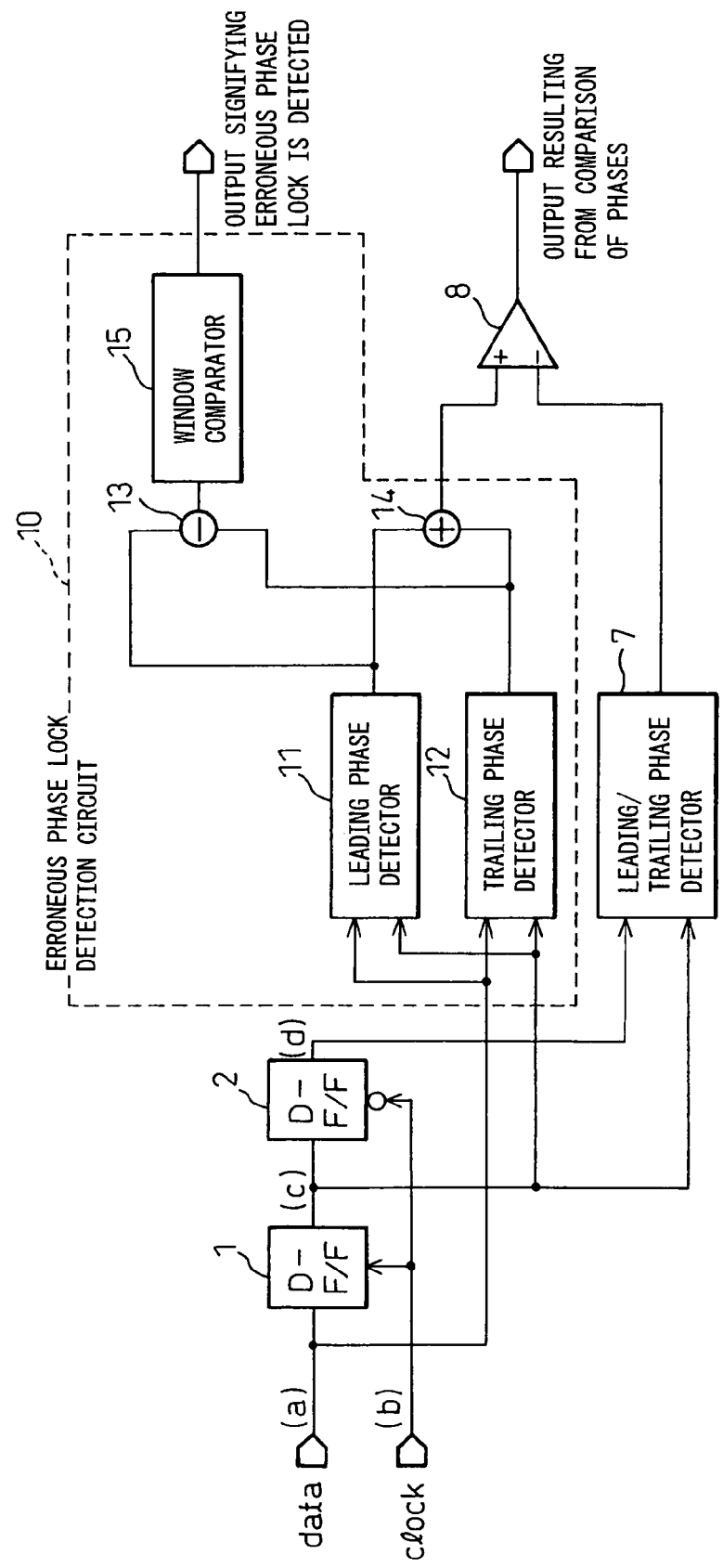
FIG. 4 shows the principles and configuration of a Hogge-type phase comparator including an erroneous phase lock detection circuit in accordance with the present invention.

FIG. 4 shows the principles and configuration of a Hogge-type phase comparator in which an erroneous phase lock detection circuit, in accordance with the present invention, is incorporated.

Figure 1:
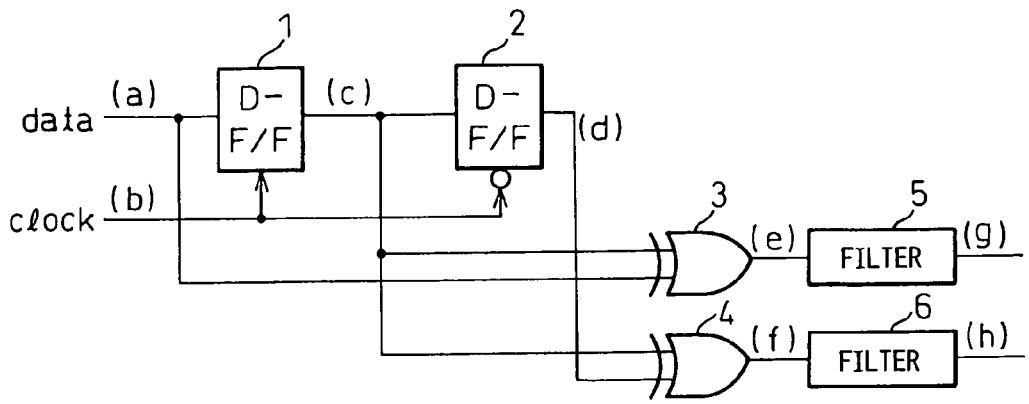
FIG. 1 shows a Hogge-type phase comparator.

Referring to FIG. 4, D flip-flops 1 and 2 are identical to those shown in FIG. 1. A leading/trailing phase detector 7 is one functional block into which the exclusive OR circuit 4 and the filter 6 shown in FIG. 1 are integrated.

The exclusive OR circuit 3 and the filter 5 shown in FIG. 1 are designed to detect both the leading and trailing edges of input data. In contrast, an erroneous phase lock detection circuit 10 in accordance with the present invention comprises a leading phase detector 11 that detects only the leading edge of input data and a trailing phase detector 12 that detects only the trailing edge thereof.

When only the leading edge of input data is discussed, the repetition frequency of the leading edge agrees with a bit rate f(1/T). The input data is therefore regarded as data having a duty cycle of 100%. Likewise, when only the trailing edge of the input data is discussed, the repetition frequency of the trailing edge agrees with the bit rate f(1/T). The input data can be regarded as data having the duty cycle of 100%.

Figure 2:
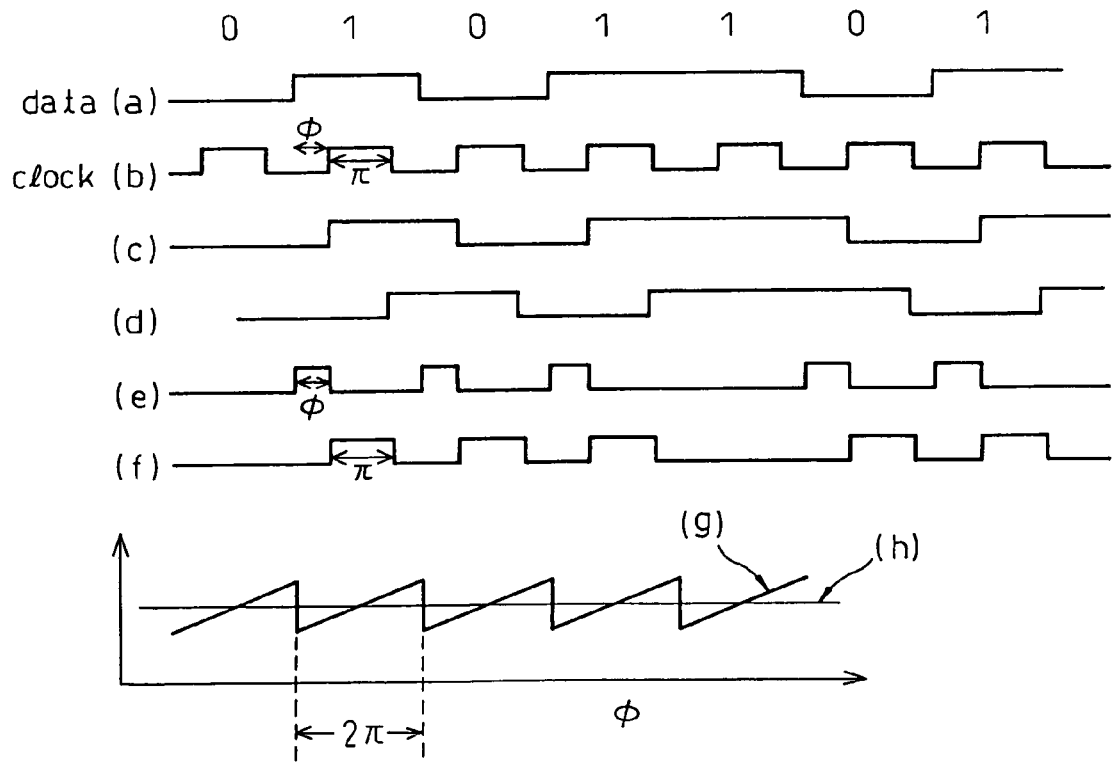
FIG. 2 is a timing chart showing the waveforms of signals observed when an NRZ signal having a duty cycle of 100% is adopted as a signal carrying data transferred to the comparator shown in FIG. 1.

Consequently, the outputs of the leading phase detector 11 and trailing phase detector 12 are sawtooth waves that, similarly to the one described in conjunction with FIG. 2 and provided when input data has a duty cycle of 100%, have slopes in the same direction within one cycle ($2\pi$). In this case, the deviation of the duty cycle of the input data from the duty cycle of 100% is manifested as a phase difference between the signals representing the leading or trailing phase of the input data.

A subtractor 13 calculates a difference between the phases detected by the leading phase detector 11 and trailing phase detector 12 respectively. When the phase difference exceeds a predetermined threshold, a window comparator 15 verifies erroneous phase lock. For example, assuming that the duty cycle of input data is 75%, when the phase difference between data and a clock attained within one cycle ($2\pi$) ranges from $1.5\pi$ to $2\pi$, the phase difference will expand. The window comparator 15 determines a threshold so that the expanded phase difference alone will be detected and, thus, detects a state of erroneous phase lock.

On the other hand, an adder 14 calculates the sum of the phases detected by the leading phase detector 11 and trailing phase detector 12 respectively. The adder 14 works equivalently to the exclusive OR circuit 3 and filter 5 that are included in the conventional comparator shown in FIG. 1 for detecting both the leading and trailing edges of input data.

The output of the adder 14 exhibits the same phase characteristic as those of an output g (FIG. 2) provided when the duty cycle of input data is 100% and of an output g (FIG. 3) provided when the duty cycle thereof is 75%. Consequently, an output of a comparator 8 resulting from comparison of phases represents either of two states of a normal phase and an erroneous phase. When the output represents the erroneous phase on a stable basis, the erroneous phase lock detection circuit 10 transmits an output signifying that erroneous phase lock is detected. According to the present invention, the output signifying that erroneous phase lock is detected is used to change a phase, onto which a clock is locking, into a normal phase.

Figure 5:
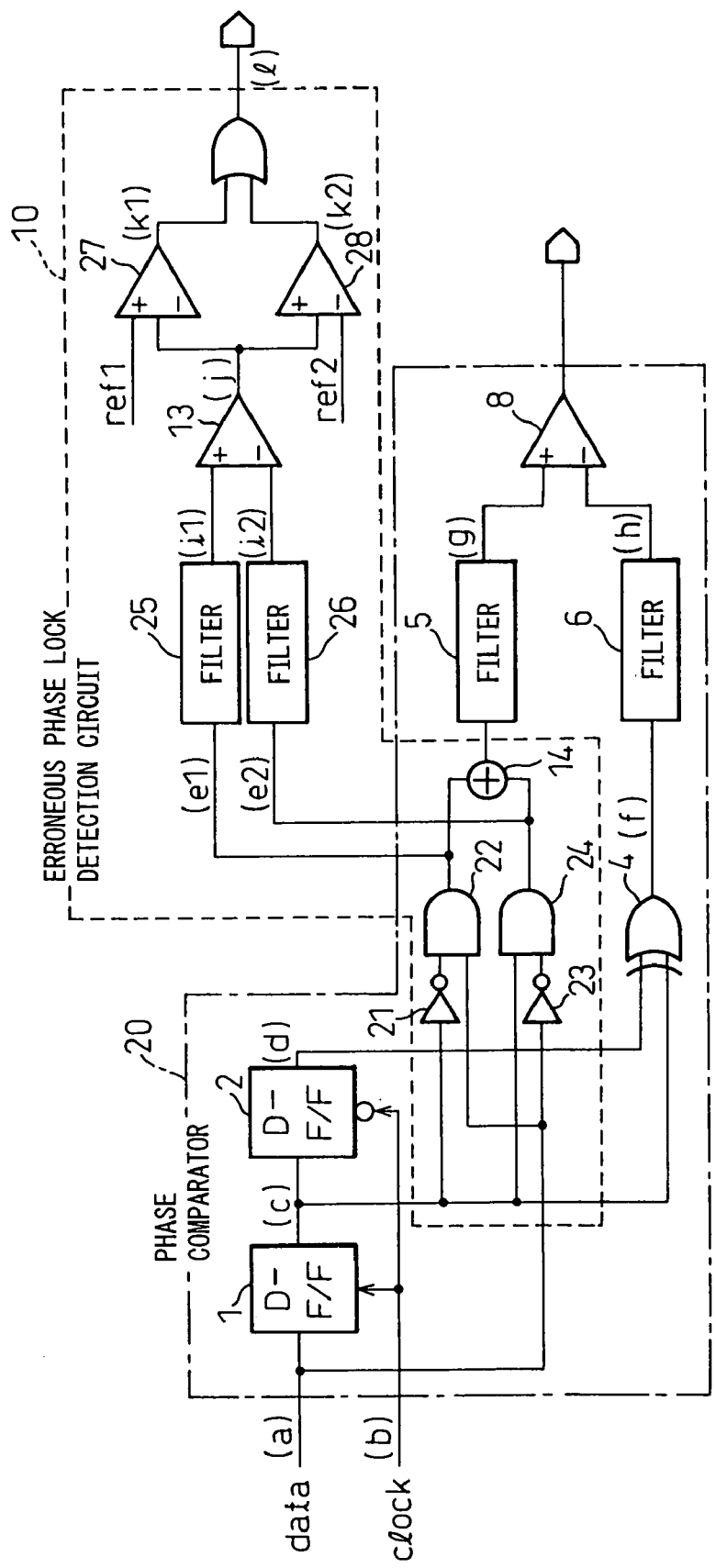
FIG. 5 shows an embodiment of the present invention.
Figure 6:
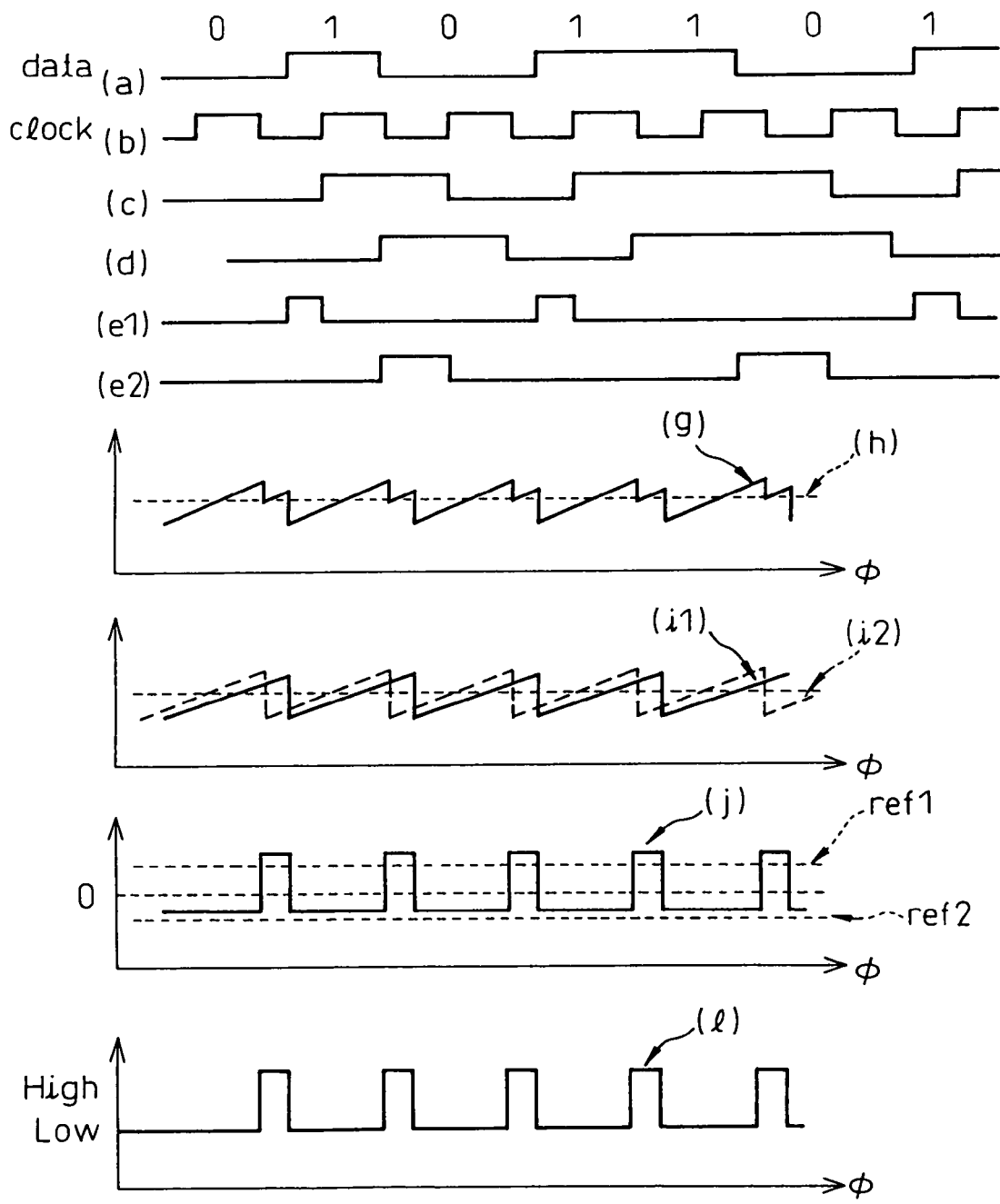
FIG. 6 is a timing chart showing the waveforms of signals observed when an NRZ signal having a duty cycle of 75% is adopted as a signal carrying data transferred to the embodiment shown in FIG. 5.

FIG. 5 to FIG. 9 show an embodiment of the present invention. FIG. 5 shows a concrete example of circuitry shown in FIG. 4. FIG. 6 to FIG. 9 are timing charts showing the waveforms of signals observed when NRZ signals having different duty cycles are employed. To begin with, a description will be made of the circuitry shown in FIG. 5 and the timing chart of FIG. 6 showing the waveforms of signals observed when an NRZ signal having a duty cycle of 75% is employed.

Referring to FIG. 5, the circuitry of a phase comparator 20 defined with a dot-dash line is identical to that shown in FIG. 1. However, the exclusive OR circuit 3 in FIG. 1 is replaced with gate circuits 21 to 24 and an adder 14 in order to implement the present invention. The gate circuits 21 to 24 and adder 14 perform a logical exclusive OR operation. For example, when an input of a D flip-flop 1 is 0 and the output thereof is 0, the logical input shall be (0,0). At this time, the adder 14 provides an output of 0. Likewise, when the logical input is (1,0) or (0,1), the output is 1. When the logical input is (1,1), the output is 0. These operations are logical operations performed by the exclusive OR circuit 3.

An output e1 of an AND circuit 22 becomes 1 only when the input of the D flip-flop 1 is 1 and the output thereof is 0. Consequently, the output e1 of the AND circuit 22 persists during a period from the leading edge of input data to the leading edge of a clock. On the other hand, an output e2 of an AND circuit 24 becomes 1 only when the input of the D flip-flop 1 is 0 and the output thereof is 1. Consequently, the output e2 of the AND circuit 24 persists during a period from the trailing edge of the input data to the leading edge of the clock.

A filter 25 rectifies a leading phase signal sent from the AND circuit 22 and transmits the resultant signal i1. Independently of the filter 25, a filter 26 rectifies a trailing phase signal sent from the AND circuit 24 and transmits the resultant signal i2. Referring to FIG. 6, the rectified outputs i1 and i2 are sawtooth waves having slopes in the same direction within one cycle ($2\pi$). The deviation of the duty cycle of the input data from the duty cycle 100% is manifested as a phase difference of $\frac{1}{4}\pi(=2\pi-\frac{3}{2}\pi)$ between the rectified outputs. Moreover, when the outputs of the AND circuits 22 and 24 are summated by the adder 14 and rectified by the filter 5, the resultant output is equivalent to the output g provided via the exclusive OR circuit 3 and filter 5 included in the conventional phase comparator.

A difference detector serving as a subtractor 13 detects a difference j between the rectified outputs. A window comparator 15 comprises two comparators 27 and 28, and detects an output which exceeds a difference between thresholds ref1 and ref2, as an erroneous-phase signal 1. In this example, the window comparator 15 detects as an erroneous-phase stage a stage from a phase $\frac{3}{2}\pi$ to a phase $2\pi$ within one cycle ($2\pi$), within which the phase difference j expands, and transmits the erroneous-phase signal 1 representing the erroneous-phase stage.

Figure 7:
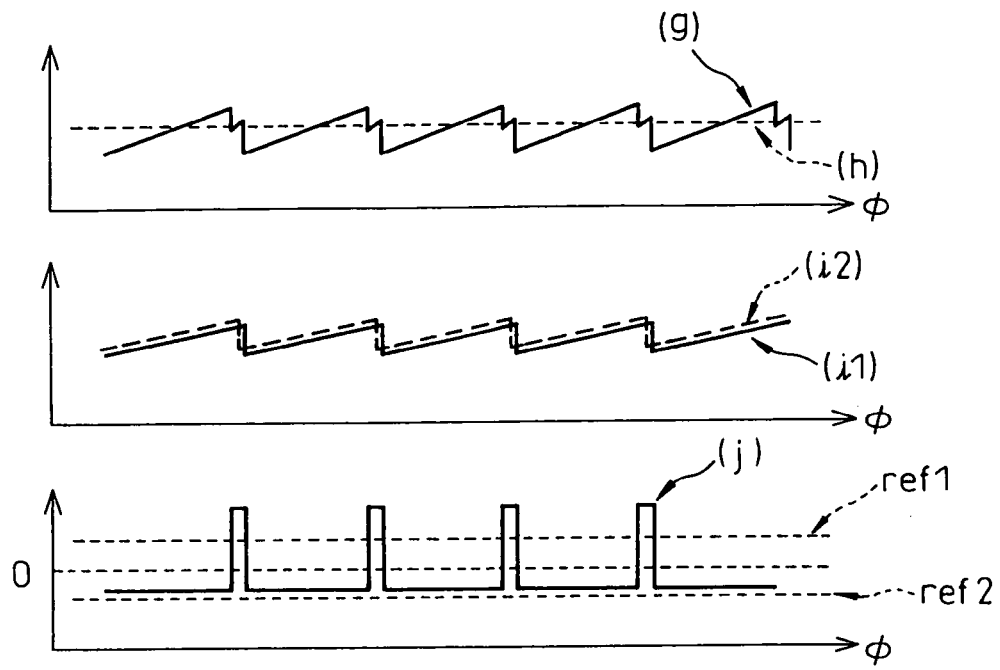
FIG. 7 shows the waveforms of signals observed when an NRZ signal exhibiting a duty cycle of 90% is adopted as a signal carrying data transferred to the embodiment shown in FIG. 5.
Figure 8:
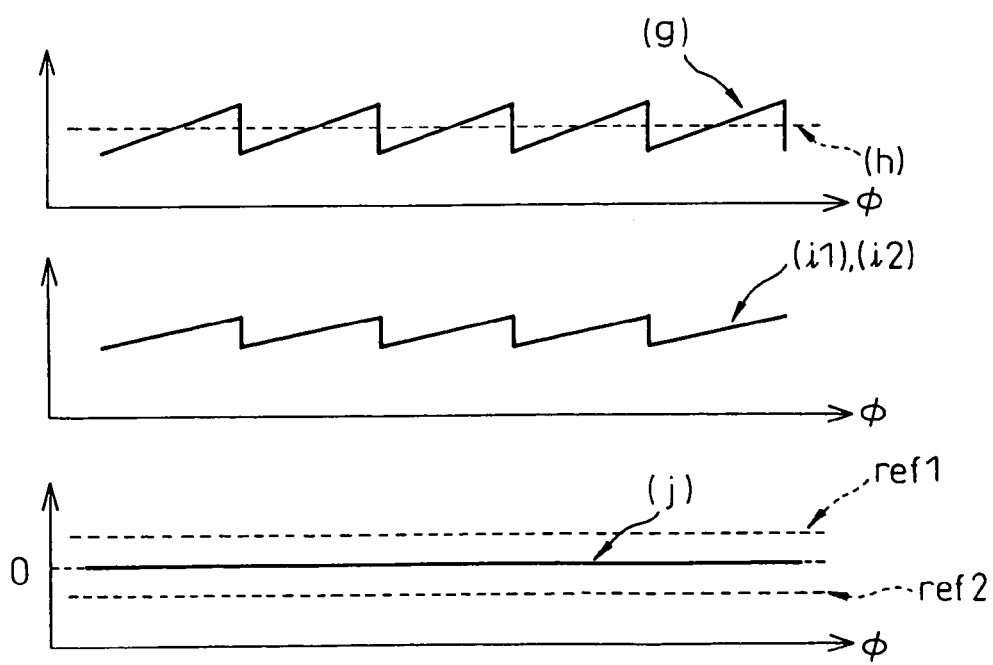
FIG. 8 shows the waveforms of signals observed when an NRZ signal having a duty cycle of 100% is adopted as a signal carrying data transferred to the embodiment shown in FIG. 5.
Figure 9:
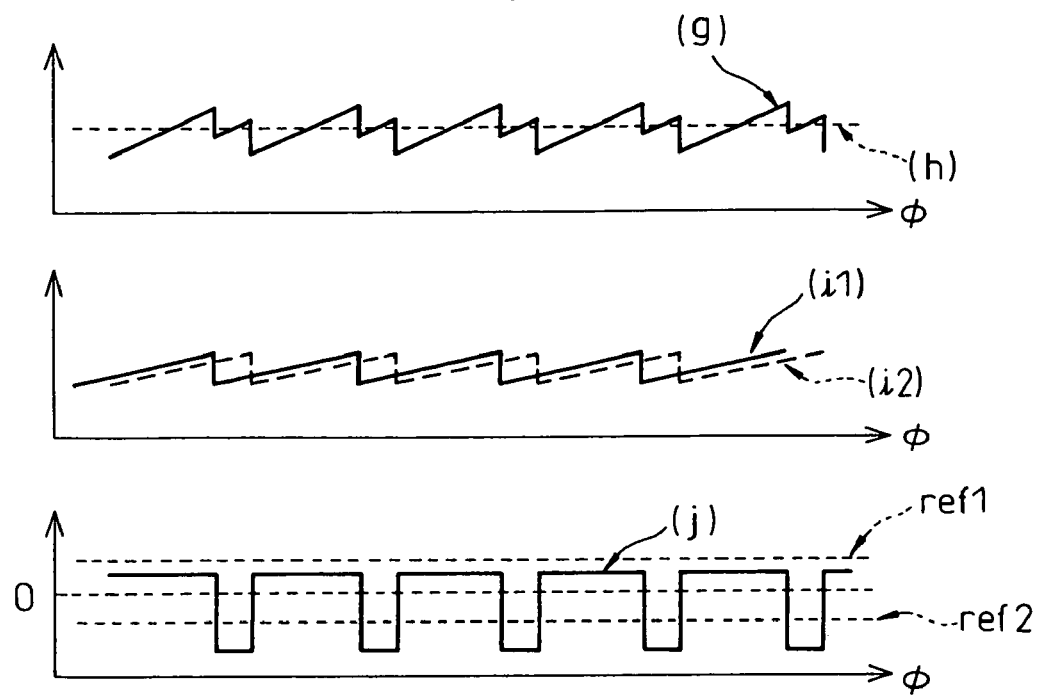
FIG. 9 shows the waveforms of signals observed when an NRZ signal having a duty cycle of 125% is adopted as a signal carrying data transferred to the embodiment shown in FIG. 5.

FIG. 7 shows an example of the waveforms of signals observed when an NRZ signal having a duty cycle of 90% is adopted. FIG. 8 shows an example of the waveforms of signals observed when an NRZ signal having a duty cycle of 100% is adopted. FIG. 9 shows an example of the waveforms of signals observed when an NRZ signal having a duty cycle of 125% is adopted. As is apparent from these drawings, whatever of the duty cycle an input signal has, outputs i1 and i2 produced by rectifying signals that represent the leading phase or trailing phase of the input data are sawtooth waves having slopes in the same direction within one cycle ($2\pi$).

Referring to FIG. 8 that shows waveforms observed when the duty cycle of input data is 100%, a phase difference between signals representing the leading or trailing phase of the input data is zero, and an output g produced by summating the signals is also a sawtooth wave having a slope in the same direction as the signals do within one cycle. On the other hand, as shown in FIG. 6, FIG. 7, and FIG. 9, when the duty cycle of input data deviates from 100%, the sawtooth wave has two phases within one cycle according to the phase difference between the signals. The stage of the sawtooth wave having the second phase is detected as an erroneous-phase stage.

Figure 10:
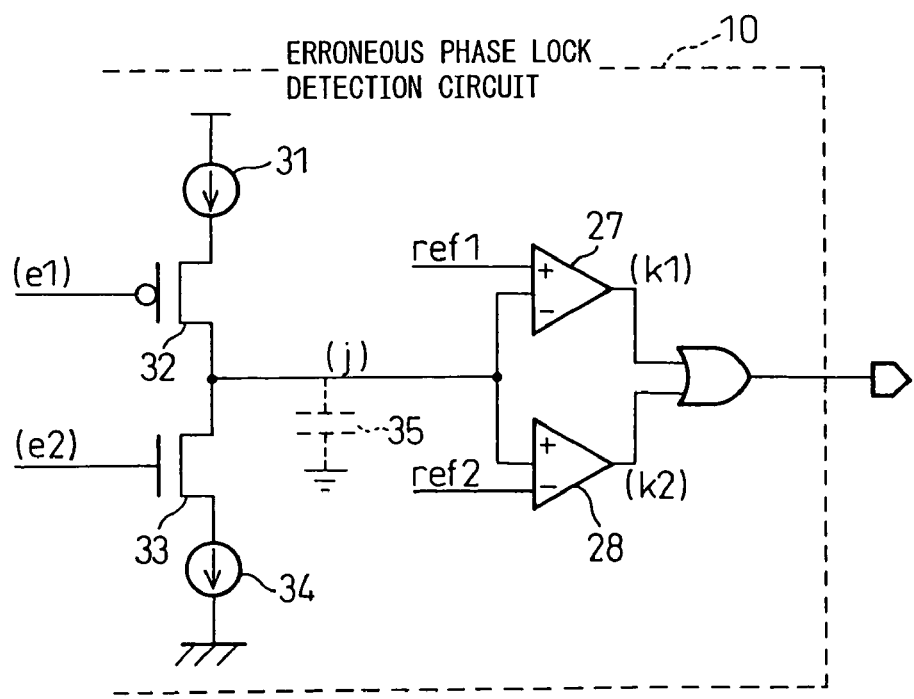
FIG. 10 shows an example of the circuitry of a difference detector.

FIG. 10 shows an example of the circuitries of the filters 25 and 26 and the difference detector 13.

Referring to FIG. 10, the difference detector 13 comprises FETs 32 and 33 constituting a charge pump and current sources 31 and 34. In this example, the outputs e1 and e2 of the AND circuits 22 and 24 are directly applied to the gates of the FETs 32 and 33 but not transferred to the filters 25 and 26 shown in FIG. 5.

When the FET 32 is set to an on state with a leading phase signal e1, a capacitor 35 in an output stage is charged by the current source 31. On the other hand, when the FET 33 is set to the on state with a trailing phase signal e2, the capacitor in the output stage is discharged by the current source 34. A different output produced by repeating the charge and discharge is transferred to the window comparator 15. In this case, the necessity of the filters 25 and 26 shown in FIG. 5 is obviated owing to the rectification achieved through the charge and discharge. A floating capacitor whose capacitance is several picofarads is adopted as the capacitor 35 drawn with dashed lines. The capacitance of several picofarads is large enough to transmit data at a bit rate at the gigabit level.

FIG. 11 to FIG. 13 show phase control circuits that, when erroneous phase lock is detected, extends control so as to lock a normal phase onto the phase of a clock.

Part (a) of FIG. 11 is a block diagram showing a first phase control circuit, and part (b) of FIG. 11 is a flowchart describing a control sequence followed by the first phase control circuit.

A phase comparator 20 and an erroneous phase lock detection circuit 10 are identical to those shown in FIG. 5. A voltage-controlled oscillator (VCO) varies an output frequency thereof according to a compared signal g sent from the phase comparator 20 so as to control, that is, advance or delay the phase of a clock referenced by the phase comparator 20. In this example, when the erroneous phase lock detection circuit 10 detects erroneous phase lock (S10 and S11), a selector 41 is controlled in order to reverse a clock that is transferred to the phase comparator 20 (changing the phase π (S12). Consequently, the phase comparator 20 detects a normal phase.

Part (a) of FIG. 12 is a block diagram showing a second phase control circuit, and part (b) of FIG. 12 is a flowchart describing a control sequence followed by the second phase control circuit.

The phase comparator 20, erroneous phase lock detection circuit 10, and voltage-controlled oscillator (VCO) are identical to those shown in FIG. 11. In this case, when the erroneous phase lock detection circuit 10 detects erroneous phase lock (S20 and S21), a switch 43 is turned on in order to forcibly step up or down (g±α) a control voltage, which is used to change the output frequency of the VCO 42, by a predetermined voltage α (S22). Consequently, a clock is unlocked from an erroneous phase, and the phase comparator 20 detects a normal phase.

Part (a) of FIG. 13 is a block diagram showing a third phase control circuit, and part (b) of FIG. 13 is a flowchart describing a control sequence followed by the third phase control circuit.

The phase comparator 20, erroneous phase lock detection circuit 10, and voltage-controlled oscillator (VCO) are identical to those shown in FIG. 11. In this example, a memory 45 periodically monitors a phase-compared signal g, records the voltage level of the signal g exhibiting a normal phase, and updates the recorded signal level. Moreover, a microscopic voltage level (g±α) is calculated by shifting the recorded voltage level by a predetermined voltage and recorded in order to lock the phase of a clock, which is locking onto an erroneous phase, onto a normal phase. A microscopic voltage generator 46 generates the microscopic voltage according to the voltage level sent from the memory.

When the erroneous phase lock detection circuit 10 detects erroneous phase lock (S30 and S31), a selector 44 is controlled in order to select the microscopic voltage generator 46. At the same time, the memory is instructed to suspend monitoring (S32 and S33). Consequently, a clock locking onto the erroneous phase is unlocked, and the phase comparator 20 detects a normal phase. In this example, compared with the examples shown in FIG. 11 and FIG. 12, high-precision control can be extended quickly.

Figure 14:
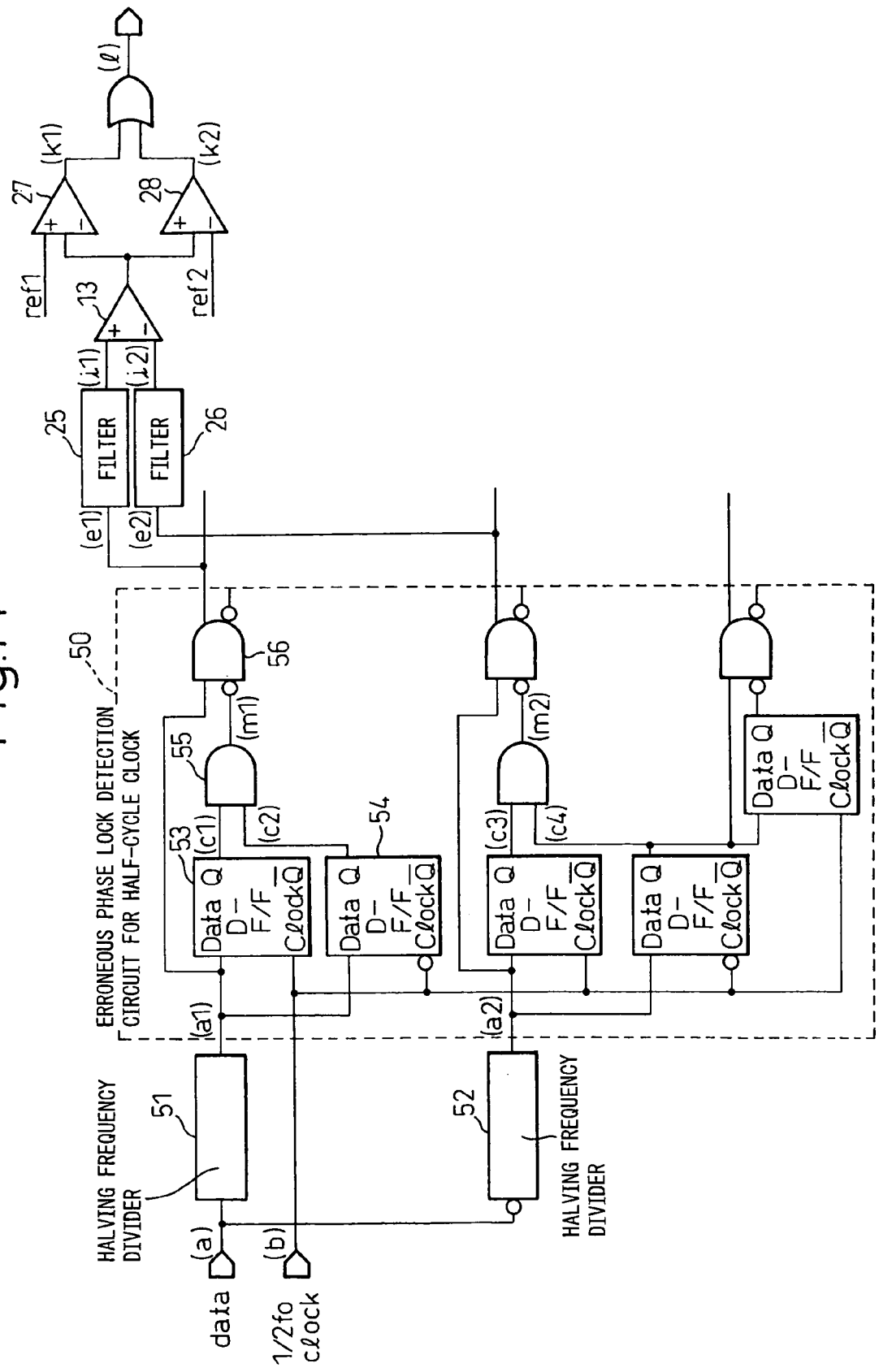
FIG. 14 shows an embodiment of the present invention employing a half-cycle clock.
Figure 15:
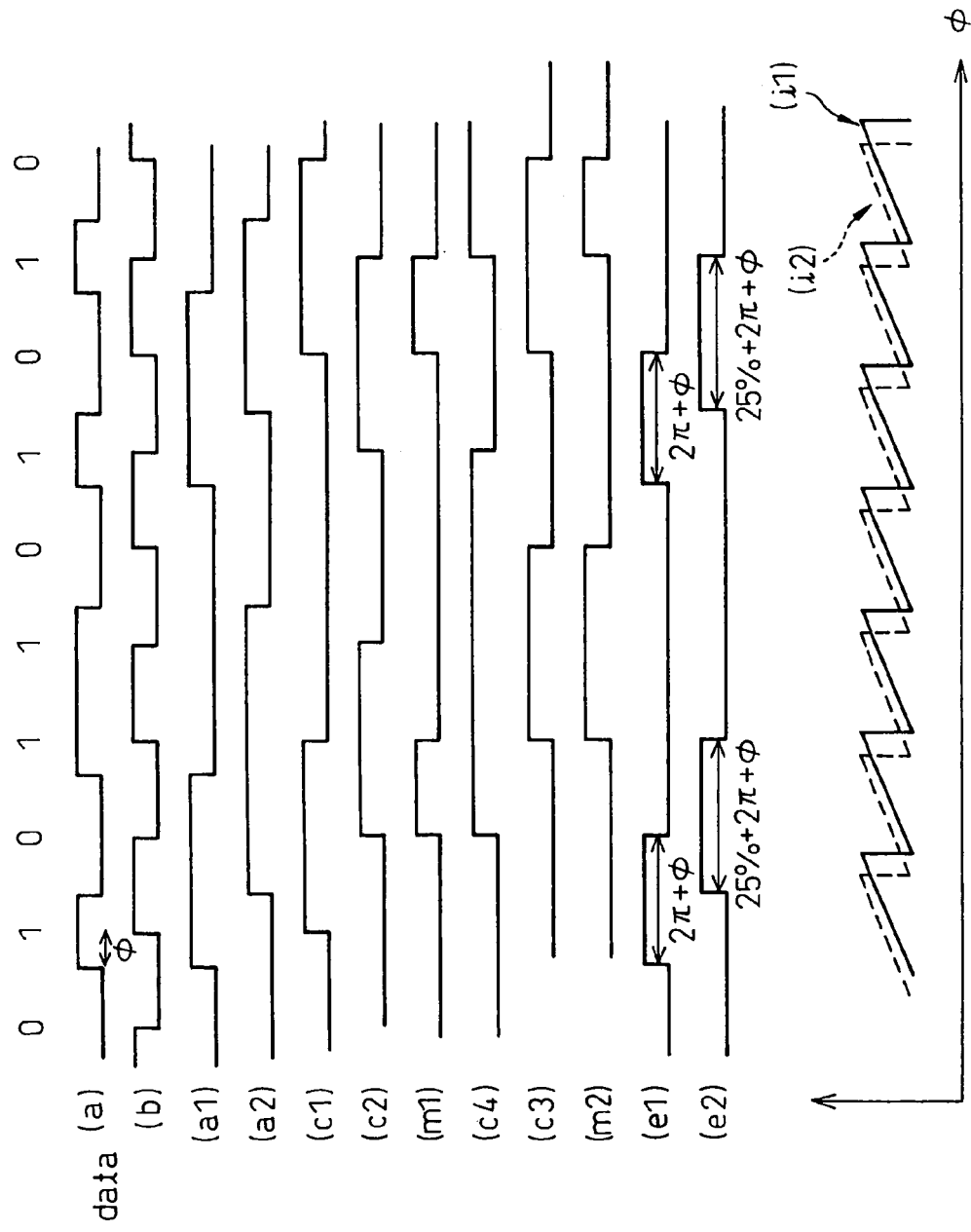
FIG. 15 is a timing chart showing the waveforms of signals observed when an NRZ signal having a duty cycle of 75% is adopted as a signal carrying data transferred to the embodiment shown in FIG. 14.

FIG. 14 and FIG. 15 show another embodiment of the present invention. FIG. 14 shows the circuitry of a phase comparator of a Hogge-type that uses a half-cycle clock according to the present invention. FIG. 15 is a timing chart showing the waveforms of signals observed when an NRZ signal having a duty cycle of 75% is adopted as a data-carrying signal.

Referring to FIG. 14, halving frequency dividers 51 and 52 are realized with, for example, T flip-flops. In this case, the halving frequency divider 51 reverses its output at the leading edge of input data, and the halving frequency divider 52 reverses its output at the trailing edge of the input data. Consequently, the halving frequency dividers 51 and 52 provide signals a1 and a2, of which frequencies are a half of the frequency of the input data, at the leading or trailing edge of the input data.

Hereinafter, the actions of the halving frequency divider 51 alone will be described. The actions of the halving frequency divider 52 are identical to those of the half frequency divider 51. A half-frequency signal a1 synchronous with the leading edge of input data a and a normal half-cycle clock $b=\frac{1}{2}f_0$ are transferred to a D flip-flop 53. A reverse half-cycle clock is transferred to the other D flip-flop 54. Herein, the half-cycle clock allowing devices to act leisurely is adopted in order to permit transmission at a bit rate of the gigabit level.

An AND of the outputs of the D flip-flops 53 and 54 is a signal m1 equivalent to a component of a half-frequency signal measured from the leading edge of the half-cycle clock to the trailing edge thereof. An AND of a reverse of the signal m1 and a half-frequency signal a1 is a phase signal e1 whose bit time is equivalent to 2π+φ and which is synchronous with the leading edge of input data a. Likewise, the halving frequency divider 52 provides a phase signal e2 whose bit time is equivalent to 2π+φ+d. Herein, φ denotes a phase difference detected by measuring a difference from the leading edge of the input data to the leading edge of the half-cycle clock. Moreover, d denotes a phase deviation from a phase of data having a duty cycle of 100%.

In this example, the half-frequency signal a1 is synchronous with the leading edge of input data a, and the half-frequency signal a2 is synchronous with the trailing edge of the input data a. The half-frequency signals can be regarded as data items having a duty cycle of 100%. Consequently, rectified outputs produced by rectifying the phase signals e1 and e2 are, as shown in FIG. 15, sawtooth waves i1 and i2 having slopes in the same direction within one cycle. Subsequent erroneous phase lock detection is identical to the aforesaid one.

As mentioned above, an erroneous phase lock detection circuit in accordance with the present invention can be adapted to a Hogge type phase comparator employing a half-cycle clock.

FIG. 16 shows an example of a phase control circuit employed when a half-cycle clock is adopted, part (a) of FIG. 16 is a block diagram thereof, and part (b) of FIG. 16 is a flowchart describing an example of a control sequence to be followed by the phase control circuit.

The phase control circuit in this example has the same configuration as that shown in the block diagram of FIG. 11. Herein, a phase comparator 49 and an erroneous phase lock detection circuit 50 which are designed to use a half-cycle clock and shown in FIG. 14 are employed, and a 90° delay circuit 47 is substituted for an inverter. When the erroneous phase lock detection circuit 50 detects erroneous phase lock (S40 and S41), a selector 48 is controlled in order to 90° delay a clock to be transferred to the phase comparator 20 (S42). Consequently, the phase comparator 49 detects a normal phase.

As described so far, according to the present invention, there is provided an erroneous phase lock detection circuit that detects an erroneous phase lock occurring when the duty cycle of data deviates from 100% and that is incorporated in a phase comparator circuit included in a PLL. When erroneous phase lock is detected, control is extended in order to detect a normal phase.

What is claimed is:

1. An erroneous phase lock detection circuit incorporated in a phase comparator that detects a phase difference between data and a clock, comprising:

a first phase detection unit that detects a phase difference by measuring a difference between the leading edge of the data and the phase of the clock and transmits an average of phase differences;

a second phase detection unit that detects a phase difference by measuring a difference between the trailing edge of the data and the phase of the clock and transmits an average of phase differences;

an erroneous phase lock verification unit that, when the difference between the average phase difference sent from the first phase detection unit and the average phase difference sent from the second phase detection unit exceeds a predetermined range, verifies an erroneous phase lock; and a control unit that controls or reverses a clock to be transferred to the phase comparator, wherein when the erroneous phase lock verification unit verifies erroneous phase lock, the control unit reverses the clock.

2. The erroneous phase lock detection circuit according to claim 1, further comprising a control unit that controls a control voltage with which the output frequency of a voltage-controlled oscillator (VCO) that generates a clock to be transferred to the phase comparator is changed, wherein when the erroneous phase lock verification unit verifies erroneous phase lock, the control unit changes the control voltage so that the phase of the clock will lock onto a normal phase.

3. An erroneous phase lock detection circuit incorporated in a phase comparator that detects a phase difference between data and a clock, comprising:

a first phase detection unit that detects a phase difference by measuring a difference between the leading edge of the data and the phase of the clock and transmits an average of phase differences;

a second phase detection unit that detects a phase difference by measuring a difference between the trailing edge of the data and the phase of the clock and transmits an average of phase differences;

an erroneous phase lock verification unit that, when the difference between the average phase difference sent from the first phase detection unit and the average phase difference sent from the second phase detection unit exceeds a predetermined range, verifies an erroneous phase lock; and a control unit that controls a control voltage with which the output frequency of a voltage-controlled oscillator (VCO) that generates a clock to be transferred to the phase comparator is changed, wherein:

the control unit comprises a memory that monitors a control voltage level during a period during which the data has a normal phase and records the control voltage level, and a control voltage generation block that generates a control voltage, of which level is changed from the recorded control voltage level by a predetermined voltage, so that the phase of the clock locking onto an erroneous phase will lock onto a normal phase, and when the erroneous phase lock verification unit verifies an erroneous phase lock, monitoring performed by the memory is suspended and the control voltage produced by the control voltage generation block is transferred to the VCO.

4. The erroneous phase lock detection circuit according to claim 3, further comprising a control unit that controls a control voltage with which the output frequency of a voltage-controlled oscillator (VCO) that generates a clock to be transferred to the phase comparator is changed, wherein when the erroneous phase lock verification unit verifies an erroneous phase lock, the control unit changes the control voltage so that the phase of the clock will lock onto a normal phase.

5. An erroneous phase lock detection circuit incorporated in a phase comparator that detects a phase difference between data and a clock, add that comprises a first frequency divider which produces at the leading edge of the data an output whose frequency is a half of the frequency of the data, a second frequency divider which produces at the trailing edge of the data an output whose frequency is a half of the frequency of the data, and a clock generator that generates a half-cycle clock by halving the frequency of the clock, the erroneous phase lock detection circuit comprising:

a first phase detection unit that detects a phase difference between data sent from the first frequency divider and the half-cycle clock and transmits an average of phase differences;

a second phase detection unit that detects a phase difference between data sent from the second frequency divider and the half-cycle clock and transmits an average of phase differences;

an erroneous phase lock verification unit that, when the difference between the average phase difference sent from the first phase detection unit and the average phase difference sent from the second phase detection unit exceeds a predetermined range, verifies erroneous phase lock; and a control unit that controls a delay to be applied to the clock inputted to said phase comparator, wherein said control unit delays the clock by 90° when said erroneous phase lock verification unit detects erroneous phase lock.

* * * * *

UNITED STATES PATENT AND TRADEMARK OFFICE
CERTIFICATE OF CORRECTION

PATENT NO. : 7,397,881 B2 Page 1 of 1
APPLICATION NO. : 11/038084
DATED : July 8, 2008
INVENTOR(S) : Daisuke Yamazaki It is certified that error appears in the above-identified patent and that said Letters Patent is hereby corrected as shown below:

Column 10, Line 17, change "add" to --and--.

Signed and Sealed this

Twenty-first Day of October, 2008

JON W. DUDAS
*Director of the United States Patent and Trademark Office*